United States Patent

Hirota

[11] Patent Number: 6,046,082
[45] Date of Patent: Apr. 4, 2000

[54] METHOD FOR MANUFACTURING SEMICONDUCTOR DEVICE

[75] Inventor: Toshiyuki Hirota, Tokyo, Japan

[73] Assignee: NEC Corporation, Tokyo, Japan

[21] Appl. No.: 09/089,541

[22] Filed: Jun. 3, 1998

[30] Foreign Application Priority Data

Jun. 5, 1997 [JP] Japan ..................................... 9-148123

[51] Int. Cl.⁷ .............................................. H01L 21/8242
[52] U.S. Cl. ............................................ 438/255; 438/398
[58] Field of Search .................................... 438/238, 239, 438/253, 255, 396, 398

[56] References Cited

U.S. PATENT DOCUMENTS

| | | | |
|---|---|---|---|
| 5,366,917 | 11/1994 | Watanabe et al. | 437/47 |
| 5,960,281 | 9/1999 | Nam et al. | 438/255 |
| 5,976,931 | 11/1999 | Yew et al. | 438/255 |
| 5,981,334 | 11/1999 | Chien et al. | 438/253 |

FOREIGN PATENT DOCUMENTS 3-272165  12/1991  Japan .
5-315543  11/1993  Japan .

*Primary Examiner*—Joni Chang
*Attorney, Agent, or Firm*—Foley & Lardner

[57] ABSTRACT

According to the present invention, there is provided a means which can prevent a formation failure of hemispherical silicon crystal grains of DRAM having a stacked capacitor structure having the hemispherical silicon crystal grains, can introduce a sufficient amount of an impurity into the hemispherical silicon crystal grains, and can prevent capacity deterioration by depletion. In the present invention, a first silicon film is formed on a semiconductor substrate incorporated with an MOS transistor and then worked into a predetermined shape, and a spontaneous oxide layer is then formed on the surface of the first silicon film. In succession, a second silicon film containing the impurity and a third silicon film containing no impurity are formed, and annealing is then done without exposing it to the atmosphere to form the hemispherical silicon crystal grains. Afterward, electrodes are separated from each other by etch back to form storage electrodes, and a dielectric film and a plate electrode are formed to prepare a capacitor.

6 Claims, 5 Drawing Sheets

METHOD FOR MANUFACTURING SEMICONDUCTOR DEVICE

BACKGROUND OF THE INVENTION

1. Field of the Invention

The Present invention relates to a semiconductor device, and more specifically, it relates to a method for manufacturing a semiconductor device having a capacitor such as DRAM (dynamic random access memory).

2. Description of the Prior Art

A DRAM in which a memory is constituted of one transistor and one capacitor has been highly integrated by the miniaturization of memory cells.

With the decrease of a memory cell area, an occupied area of a capacitor decreases, so that it is difficult to secure a stored charge capacity (about 25 fF) required for soft error resistance.

At present, a storage electrode called a stack type has been widely used, and a technique has been used in which fine hemispherical silicon crystal grains, i.e., an HSG-Si (hemispherical grain-silicon) is formed on the surface of the storage electrode to increase a virtual surface area of the electrode.

The formation of this HSG-Si can be accomplished by annealing a clean amorphous silicon film surface in an amorphous-crystalline transition temperature range to form crystal nuclei on the amorphous silicon film surface, and then allowing crystals to grow by the surface migration of a silicon atom.

Therefore, the amorphous silicon film surface which is a parent body is required to be a clean surface which is free from a spontaneous oxide layer and organic contaminants, and an annealing atmosphere at the formation of the HSG-Si is also required to be a high vacuum atmosphere or a non-oxidizing atmosphere.

Furthermore, the surface of crystallized silicon is more stable than that of amorphous silicon, and on the surface of crystallized silicon, the surface migration of the silicon atom scarcely occurs, so that any HSG-Si is not formed. Therefore, the surface on which the HSG-Si is formed must be the surface of amorphous silicon.

Techniques for forming the HSG-Si can be classified into a selective HSG method and a blanket HSG method in accordance with a film formation principle, and these methods have the following merits and demerits.

The selective HSG method is a method in which the HSG is selectively formed only on the surface of a previously formed storage electrode, and after the film formation, an etch back step is not necessary in contrast to the blanket HSG method. Hence, the selective HSG method has a merit that the number of steps is small.

Japanese Patent Application Laid-open No. 315543/1993 has suggested a method which comprises patterning a storage electrode by the use of the selective HSG method, depositing amorphous silicon, carrying out the etch back to separate electrodes from each other, and then forming the HSG-Si.

Furthermore, in the selective HSG method, the shape of the storage electrode is not restricted by the etch back step, and therefore, the selective HSG method has a merit that it is also applicable to the storage electrode having an intricate shape such as a cylinder type or a fin type.

However, the HSG formation by the selective HSG method depends very sensitively on the state on an electrode surface, and particularly, it has a problem that there easily occurs a fault that any HSG is not formed owing to the presence of a spontaneous oxide layer and contamination with organic substances.

On the contrary, the blanket HSG method is a method in which the HSG is formed all over, as denoted by its name. In the first place, an amorphous silicon film which is a parent body is formed all over, and annealing is successively carried out without exposing the amorphous silicon film to the atmosphere to form the HSG.

Accordingly, the blanket HSG method has a merit that any spontaneous oxide layer and any contamination with organic substances do not take place. However, owing to the overall film formation, the storage electrodes are required to be separated from each other by a technique such as the etch back, and the shape of the electrodes are restricted by the etch back step.

Next, a conventional technique will be described mainly in accordance with the blanket HSG method with reference to FIGS. 3(a) to 3(e).

Firstly, as shown in FIG. 3(a), a contact hole is formed in a drain 2 of a semiconductor substrate incorporated with an MOS-FET and the like, and a first silicon film 9 containing phosphorus as an impurity is then formed in an amorphous state by the use of an already known vacuum chemical vapor growth method.

Next, as shown in FIG. 3(b), the first silicon film 9 is worked into a desired shape by an already known photo-etching technique to form a part of a storage electrode. In FIG. 3(b), a single storage electrode is only shown, but in fact, this is formed in the form of dumbbells.

Afterward, a spontaneous oxide layer on the first silicon film 9 is removed therefrom with diluted hydrofluoric acid or the like, and as shown in FIG. 3(c), a second silicon film 15 is formed all over from a gas system containing silane ($SiH_4$) or disilane ($Si_2H_6$) by the use of a vacuum chemical vapor growth method. At this time, film formation conditions are set so that the second silicon film 15 may be in an amorphous state.

Successively, annealing is carried out in a high vacuum atmosphere or a non-oxidizing atmosphere without exposing the second silicon film 15 to the atmosphere, thereby allowing hemispherical silicon crystal grains 13 to grow on the surface of the second silicon film 15, as shown in FIG. 3(d).

Afterward, etch back is done by the use of an already known anisotropic dry etching technique to separate storage electrodes from each other, as shown in FIG. 3(e).

Next, a dielectric film and a plate electrode are formed to prepare a capacitor (not shown).

The blanket HSG method is insensitive to the spontaneous oxide layer and the organic contaminants on the surface of the storage electrode, and it has a wide process margin. Hence, the blanket HSG method is considered to be an excellent method.

In the blanket HSG method, however, a fault that the storage electrode is not partially converted into the HSG or does not grow to a sufficient size tends to take place with the increase in the film thickness of the first silicon film 9.

The storage electrode which is not converted into the HSG is short of a capacity, so that it has drawback that a normal operation is impossible and a bit failure occurs.

According to the results of inspection, it has been elucidated that a part of the first silicon film 9 is crystallized, whereby the second silicon film 15 is also crystallized prior to the growth of the HSG-Si. As discussed above, any HSG-Si is not formed on the crystallized surface.

The reason why the occurrence of the fault increases with the increase in the film thickness of the first silicon film 9 is that a heat history is prolonged by the prolongation of a film formation time, so that crystal nuclei are easily formed in the film or between the film and an undercoat.

It can be considered that since the velocity of the crystal growth in the film is higher than the film formation velocity of amorphous silicon, the crystallization reaches the surface.

In the conventional technique, electrical connection is considered to be important, and hence, after the removal of the spontaneous oxide layer on the surface of the storage electrode, the second silicon film 15 is formed. Therefore, as shown in FIG. 4, it can be presumed that when the first silicon film is crystallized, this fact further leads to the crystallization of the second silicon film 15.

Thus, by treating the surface with a mixed solution of ammonia and aqueous hydrogen peroxide prior to the formation of the second silicon film 15, and then covering the surface with a dense spontaneous oxide layer in order to shut out the influence by the crystallization of the first silicon film 9, the fault that the HSG is not obtained has been remarkably reduced.

On the other hand, there occurs another problem that an impurity is not sufficiently fed to the formed HSG, so that a capacity cannot be increased as expected owing to depletion.

The formed HSG-Si does not contain any impurity, so long as it is not subjected to any treatment. Therefore, a certain means should be taken to introduce the impurity thereinto.

In the conventional technique, the impurity in the first silicon film 9 is thermally diffused into the HSG-Si through the second silicon film 15, but it has been apparent that the spontaneous oxide layer which is formed prior to the formation of the second silicon film 15 functions as a barrier or a trap of the impurity diffusion, so that the impurity is not sufficiently fed to the HSG-Si.

Thus, in order to easily feed the impurity to the HSG-Si, it was attempted that the second silicon film 15 was doped with the impurity and the HSG-Si is then formed. In this case, however, the growth rate of the HSG-Si was low, so that the sufficiently large HSG-Si could not be obtained. FIG. 5 shows a relation between an annealing time at 565° C. and the grain size of the HSG-Si.

When the size of the HSG-Si is regulated to, for example, 70 nm, an annealing time of about 50 minutes is necessary in the case of doped amorphous silicon of 2.03E20 [atoms/cc] (a curve x in FIG. 5), though an annealing time of about 5 minutes is enough in the case of non-doped amorphous silicon (a curve • in FIG. 5).

In the case that phosphorus is contained as the impurity in the amorphous silicon film which is the parent body, the surface migration of a silicon atom is determined by the elimination of phosphorus, and the higher the concentration of the impurity is, the lower the growth rate of the HSG-Si is.

On the contrary, the crystals in the film grow more easily when the impurity concentration is high, and if the crystals in the second silicon film 15 grow and reach the surface before the HSG-Si grows sufficiently, the growth of the HSG-Si stops. Therefore, even if the annealing time is merely prolonged, the large grains cannot always be obtained.

As described above, by the conventional techniques, it has been difficult that the impurity is sufficiently introduced into the HSG-Si, while the HSG-Si formation failure due to the crystallization is restrained, to obtain a high capacity value.

SUMMARY OF THE INVENTION

An object of the present invention is to provide a method for manufacturing a semiconductor device which is free from the above-mentioned problems, can prevent an HSG-Si formation failure with crystallization, can easily control the growth rate of an HSG-Si, can sufficiently feed an impurity to the HSG-Si, and can prevent a capacity from deteriorating due to depletion.

The above-mentioned objects can be achieved by the present invention which will be described hereinafter.

That is to say, the present invention discloses a method for manufacturing a semiconductor device having a capacitor comprising an upper electrode, a dielectric film and a Lower electrode, wherein said lower electrode is formed by a step of forming a first silicon film containing an impurity in an amorphous state or a polycrystal state on one main surface of a semiconductor substrate by a vacuum chemical vapor growth method, a step of working the first silicon film into a predetermined shape, a step of forming a spontaneous oxide layer on the surface of the first silicon film, a step of forming a second silicon film containing an impurity all over in the amorphous state by the vacuum chemical vapor growth method, a step of forming a third silicon film containing no impurity all over in the amorphous state by the vacuum chemical vapor growth method without exposing the same to the atmosphere, a step of annealing the third silicon film in a non-oxidizing atmosphere without exposing the same to the atmosphere to crystallize the third silicon film and to thereby form hemispherical silicon crystal grains all over, and a step of carrying etch back by anisotropic etching; and a semiconductor device obtained by this manufacturing method.

A method for manufacturing a semiconductor device of the present invention is a method for manufacturing a semiconductor device having a capacitor comprising an upper electrode, a dielectric film and a lower electrode, wherein said lower electrode is formed by a step of forming a first silicon film containing an impurity in an amorphous state or a polycrystal state on one main surface of a semiconductor substrate by a vacuum chemical vapor growth method, a step of working the first silicon film into a predetermined shape, a step of forming a spontaneous oxide layer on the surface of the first silicon film, a step of forming a second silicon film containing an impurity all over in the amorphous state by the vacuum chemical vapor growth method, a step of forming a third silicon film containing no impurity all over in the amorphous state by the vacuum chemical vapor growth method without exposing the same to the atmosphere, a step of annealing the third silicon film in a non-oxidizing atmosphere without exposing the same to the atmosphere to crystallize the third silicon film and to thereby form hemispherical silicon crystal grains all over, and a step of carrying etch back by anisotropic etching.

The method for manufacturing the semiconductor device of the present invention is characterized in that the thickness of the spontaneous oxide film on the surface of the first silicone film is 2 nm or less, and the method for manufacturing the semiconductor device of the present invention is also characterized in that the impurity which is added to the second silicon film is phosphorus, and the concentration of phosphorus is in the range of 1 to 3E20 [atoms/cc].

Furthermore, the method for manufacturing the semiconductor device of the present invention is characterized in that the thickness of the second silicon film is in the range of 10 to 70 nm, and the method for manufacturing the semiconductor device of the present invention is also characterized in that the thickness of the third silicon film is in the range of 5 to 60 nm.

In these drawings, 1 is a semiconductor substrate, 2 is a drain, 3 is a source, 4 is a gate electrode, 5 is a field oxide layer, 6 is a first interlaminar insulating film, 7 is a bit line, 8 is a second interlaminar insulating film, 9 is a first silicon film, 9a is a crystallized first silicon film, 10 is a spontaneous oxide film, 11 is a second silicon film (the present invention), 12 is a third silicon film (the present invention), 12a is a crystallized second silicon film (a conventional technique), 13 is a hemispherical silicon crystal grain (HSG-Si), 14 is an unevenness transferred by etch back, and 15 is a second silicon film (a conventional technique).

DETAILED DESCRIPTION OF THE PREFERRED EMBODIMENTS

Next, the present invention will be described in more detail in accordance with examples with reference to drawings, but the scope of the present invention should not be limited at all by these examples.

EXAMPLE 1

Figure 1A:
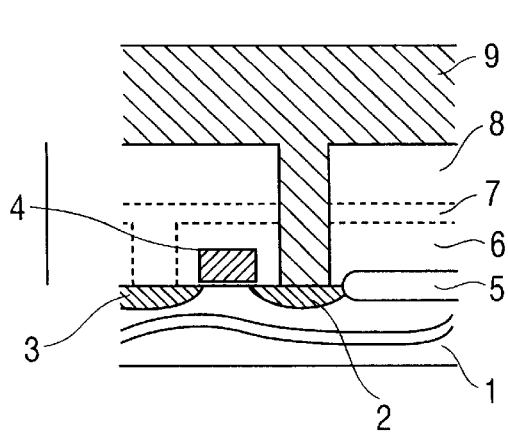
FIGS. 1(a)–1(e) are is a process illustrative views regarding first and second embodiments of the present invention.

A first embodiment of the present invention will be described with reference to FIGS. 1(a) to 1(e). In the first place, as shown in FIG. 1(a), a contact hole is formed in a drain 2 of a semiconductor substrate incorporated with an MOS-FET and the like, and a first silicon film 9 containing phosphorus as an impurity is then formed in an amorphous state by the use of an already known vacuum chemical vapor growth method.

Figure 1D:
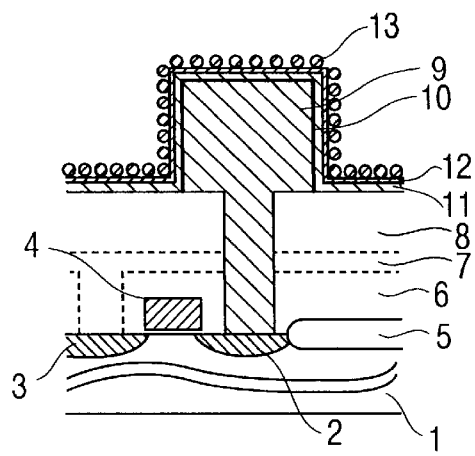
Figure 1B:
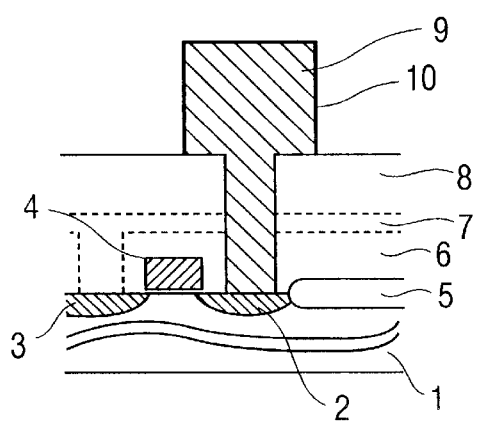

Next, as shown in FIG. 1(b), the first silicon film 9 is worked into a desired shape by an already known photo-etching technique to form a part of a storage electrode. The serial operation until this step is the same as a conventional technique.

Next, the substrate is immersed in a mixed solution of ammonia and aqueous hydrogen peroxide at 60° C. for 3 minutes to remove particles and to simultaneously form a dense spontaneous oxide film 10 on the surface of the first silicon film 9.

In this embodiment, a technique of using ammonia-aqueous hydrogen peroxide (APM washing) is taken, but any manner such as the employment of sulfuric acid-aqueous hydrogen peroxide (SPM washing) is also acceptable, so long as it permits the formation of the dense oxide film having a thickness of about 2 nm. These manners have quite usually been used as washing manners in a semiconductor manufacturing process.

This spontaneous oxide layer is sufficiently thin, so that an electrical connection can be secured by tunnel current without any problem. Another manner such as low-temperature oxidation or rapid thermal oxidation can be contrived to form the extremely thin thermal oxide layer, but if the thickness of the layer is in excess of 3 nm, the resistance of the oxide layer itself is not negligible any more. Hence, much attention should be paid to the film thickness.

Figure 2:
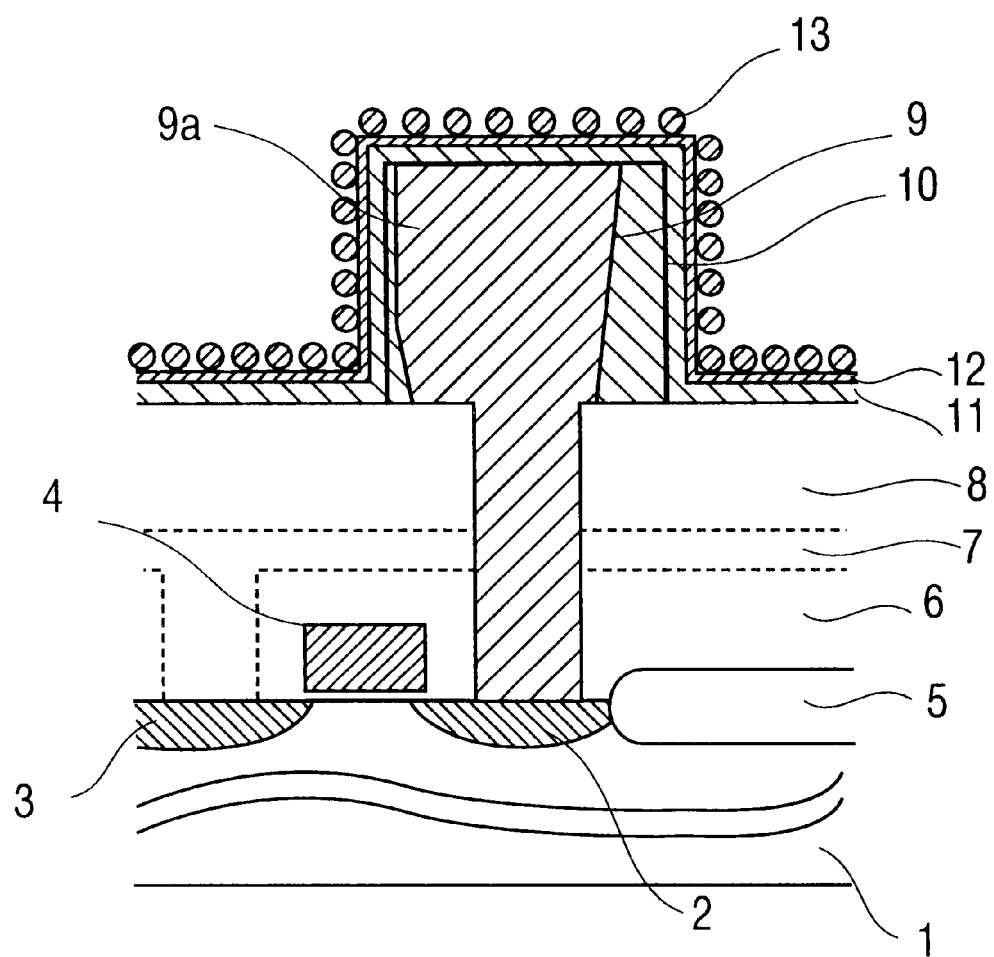
FIG. 2 is a schematic sectional view regarding first and second embodiments of the present invention.
Figure 3A:
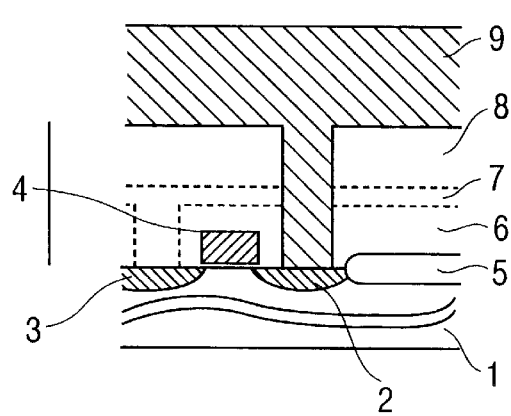
FIG. 3(a)–3(e) are is a process illustrative views regarding a conventional technique.
Figure 3D:
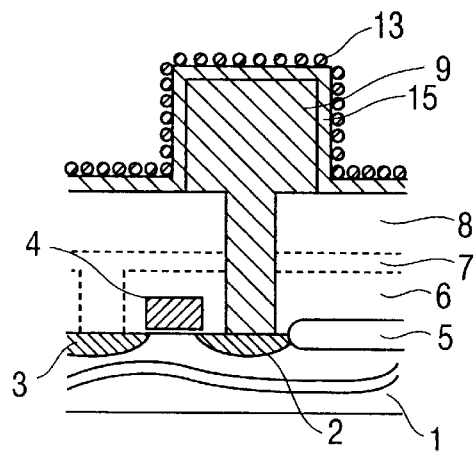
Figure 3B:
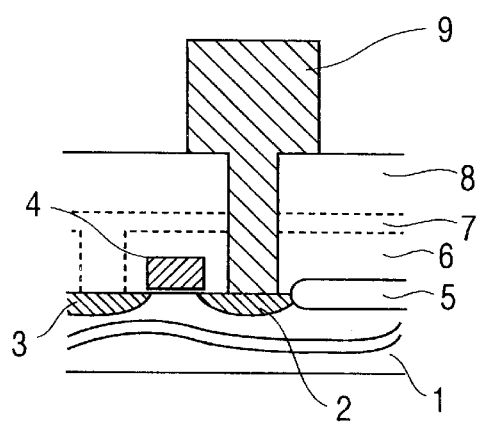
Figure 3E:
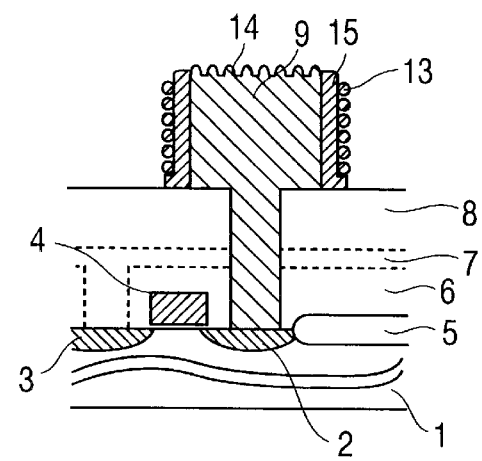
Figure 3C:
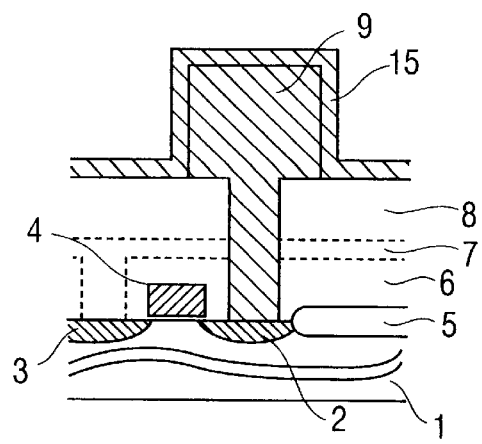
Figure 4:
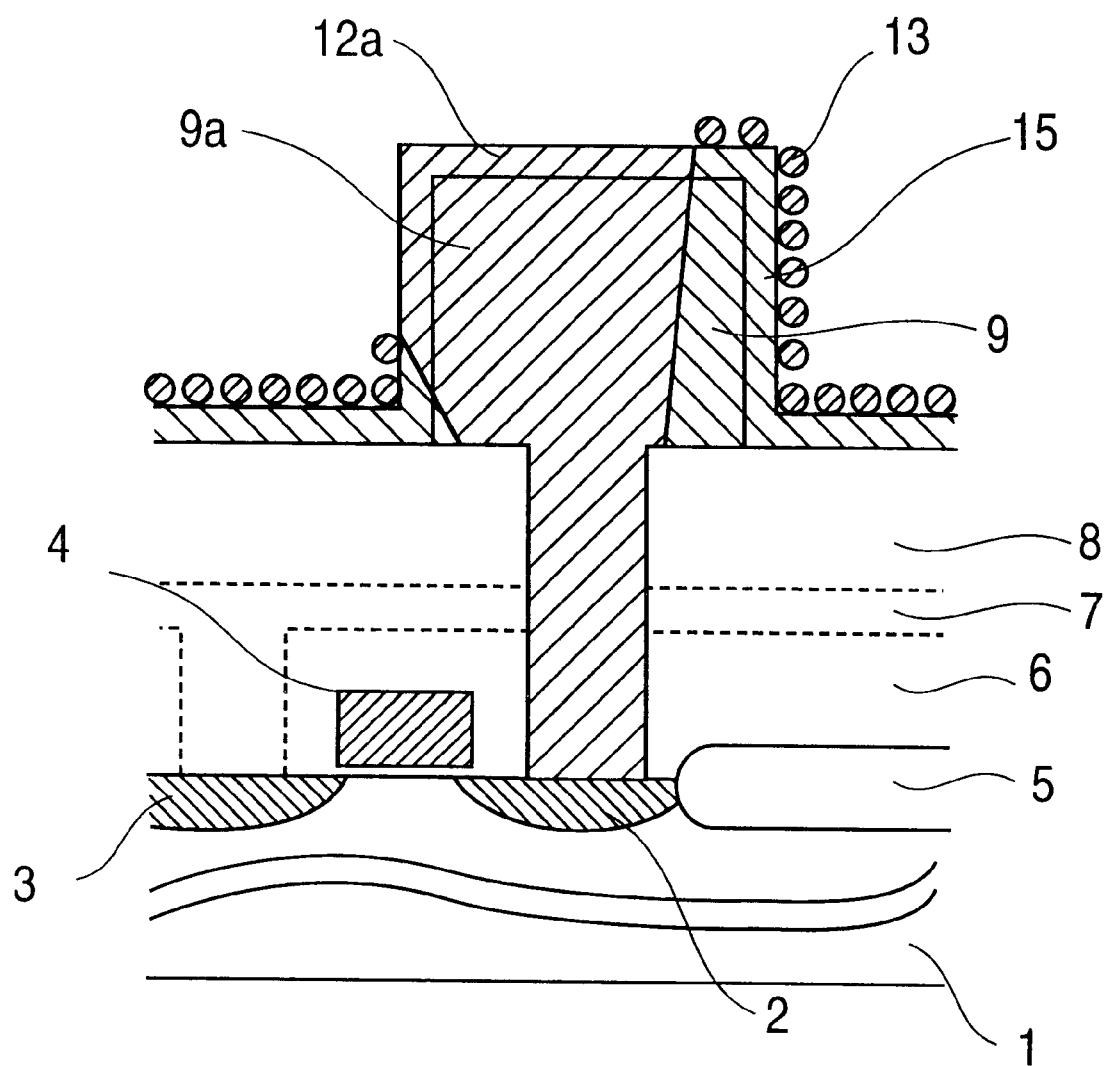
FIG. 4 is a schematic sectional view showing an HSG-Si formation failure by the conventional technique.

By covering the first silicon film 9 with the dense spontaneous oxide film in this manner, a second silicon film 11 and a third silicon film 12 which will be subsequently formed as shown in FIG. 2 can be protected from crystallization due to crystals made in the first silicon film 9 which is an undercoat.

Figure 1E:
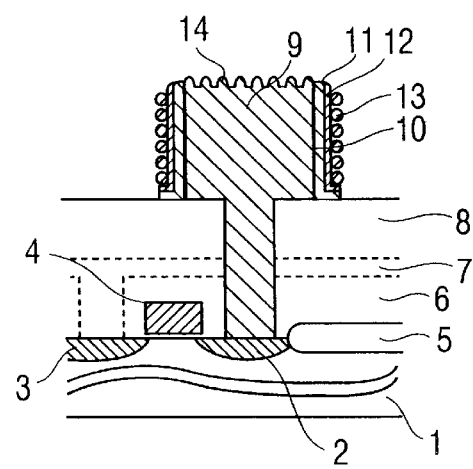
Figure 1C:
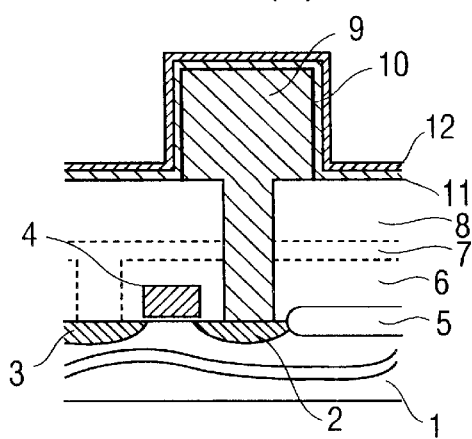

Next, as shown in FIG. 1(c), the second silicon film 11 containing phosphorus as an impurity is formed all over from a gas system containing silane ($SiH_4$) or disilane ($Si_2H_6$) by the use of a vacuum chemical vapor growth method.

The concentration of phosphorus in the film is in the range of 1.0E20 to 3.0E20 [atoms/cc]. If the concentration is less than this range, the feed of phosphorus into the HSG-Si is insufficient, and if it is more than this range, the crystallization easily begins in the film.

The second silicon film 11 is formed so that its thickness may be in the range of about 10 to 70 nm. If the thickness of the second silicon film 11 is less than 10 nm, it is difficult to sufficiently diffuse the impurity into the HSG-Si in a subsequent heating step.

Next, the third silicon film 12 is successively formed so that its thickness may be in the range of about 5 to 60 nm from a gas system containing silane ($SiH_4$) or disilane ($Si_2H_6$) without exposing the same to the atmosphere.

If the thickness of the third silicon film 12 is less than 5 nm, the third silicon film 12 is promptly consumed for the growth of the HSG-Si in a subsequent annealing step, so that the HSG having a sufficient size cannot be obtained. If it is more than 60 nm, it is difficult lo thermally diffuse the impurity from the second silicon film.

The film formation conditions of the second silicon film 11 and the third silicon film 12 are to be set so that they may be in an amorphous state, and this amorphous state is possible at a film formation temperature in the range of 530 to 590° C. under a film formation pressure in the range of 0.2 to 80 Torr. In general, the conditions of the low film formation temperature and the high film formation pressure can easily give the amorphous state.

By forming the second silicon film 11 containing the impurity and the third silicon film 12 containing no impurity in this way, the sufficient amount of the impurity can be fed to the HSG in the subsequent heating step without lowering the growth rate of the HSG, and while an HSG formation failure by the crystallization can be prevented, the problem of capacity deterioration by depletion can be solved.

Next, the feed of the gas is stopped, and annealing is then carried out in the vicinity of a transition temperature of the amorphous state-crystallization without exposing it to the atmosphere to form the HSG-Si all over, as shown in FIG. 1(d).

Figure 5:
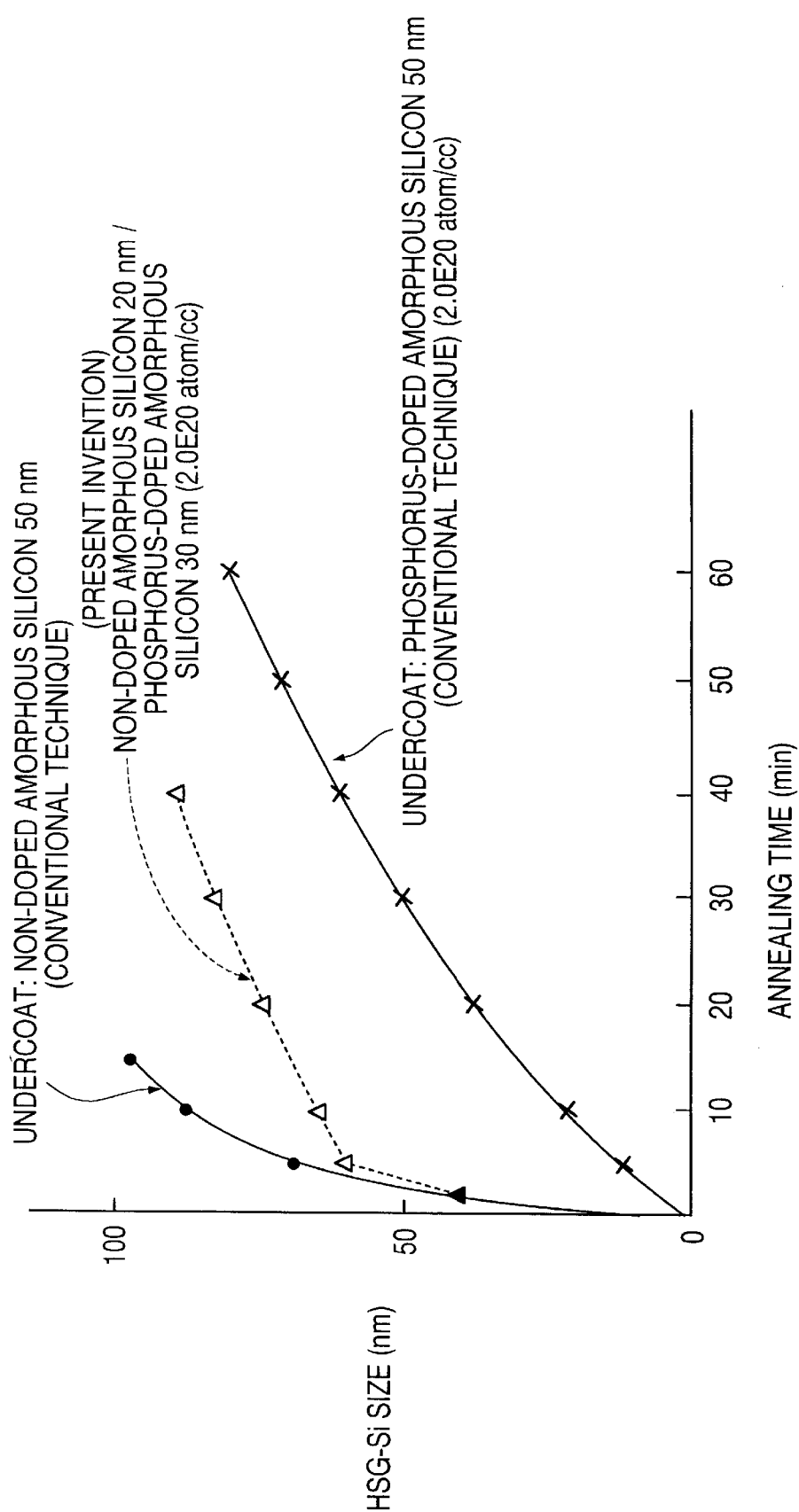
FIG. 5 is a graph showing a relation between the grain size of the HSG-Si and an annealing time.

An annealing temperature is preferably in the range of 550 to 580° C. FIG. 5 shows a relation between the annealing time and the grain size of the HSG-Si in the case that amorphous silicon having a thickness of 30 nm and including 2.0E20 [atoms/cc] of phosphorus as the impurity is used as the second silicon film 11 and non-doped amorphous silicon having a film thickness of 20 nm is used as the third silicon film 12 (a curve Δ in FIG. 5).

The reason why the growth rate of the curve Δ abruptly drops when the grain size is in excess of 60 nm is that the third silicon film is consumed for the growth of the HSG-Si, so that the second silicon film is exposed.

If this phenomenon is used, the growth rate can be lowered at the point of an optional grain size, and hence the grain size can be easily controlled (FIG. 1(e) and FIG. 2 show each a case where the third silicon film 12 remains).

Afterward, etch back is carried out by the use of an anisotropic dry etching technique to separate storage electrodes from each other, as shown in FIG. 1(e).

Next, a dielectric film and a plate electrode are formed to prepare a capacitor (not shown).

Here, the dielectric film has an oxide film-nitride film structure, and it is formed by subjecting, to a pyrogenic oxidation at 850° C. for 20 minutes, a part of the surface of a silicon nitride film formed by a vacuum chemical vapor growth method. By a heat history at this time, the impurity is thermally diffused into the HSG-Si.

EXAMPLE 2

A second embodiment of the present invention intends to form a first silicon film 9 in a polycrystal state in FIG. 1(a). In the present invention, as shown in FIG. 1(b), the surface of the first silicon film 9 is covered with a dense spontaneous oxide film 10 prior to the formation of a second silicon film 11 [see FIG. 1(c)]. Therefore, even if the first silicon film 9 crystallizes, this crystallization does not have any influence on the second silicon film 11.

Therefore, after the first silicon film is formed and patterned, phosphorus may be introduced by the thermal diffusion of $POCl_3$.

In this case, a phosphorus glass layer is removed with diluted hydrofluoric acid or the like, followed by immersion in a mixed solution of sulfuric acid and aqueous hydrogen peroxide for 5 minutes, thereby forming a spontaneous oxide film. Afterward, the same procedure as in the first embodiment described above is conducted to form a capacitor.

According to the present invention, as described above, the surface of a first silicon film is covered with a dense spontaneous oxide film, whereby an HSG-Si formation failure due to crystallization can be prevented. Furthermore, an amorphous silicon film which is a parent body for HSG formation is divided into a second silicon film containing an impurity and a third silicon film, whereby the growth rate of the HSG-Si can easily be controlled, the sufficient amount of the impurity can be fed to the HSG-Si, and a capacity deterioration by depletion can be prevented.

What is claimed is:

1. A method for manufacturing a semiconductor device having a capacitor the method comprising the steps of: forming an upper electrode, a dielectric film and a lower electrode, wherein said lower electrode is formed by the steps of: forming a first silicon film containing an impurity in an amorphous state or a polycrystal state on one main surface of a semiconductor substrate by a vacuum chemical vapor growth method; patterning the first silicon film into a shape; forming a spontaneous oxide layer on the surface of the first silicon film; forming a second silicon film containing an impurity all over in the amorphous state by the vacuum chemical vapor growth method; forming a third silicon film containing no impurity all over in the amorphous state by the vacuum chemical vapor growth method without exposing to atmosphere; annealing the third silicon film in a non-oxidizing atmosphere without exposing to the atmosphere to crystallize the third silicon film and to thereby form hemispherical silicon crystal grains all over; and carrying etch back by anisotropic etching.

2. The method for manufacturing the semiconductor device according to claim 1 wherein the thickness of the spontaneous oxide film on the surface of the first silicone film is 2 nm or less.

3. The method for manufacturing the semiconductor device according to claim 1 wherein the impurity which is added to the second silicon film is phosphorus.

4. The method for manufacturing the semiconductor device according to claim 3 wherein the concentration of phosphorus which is added to the second silicon film is in the range of 1 to 3E20.

5. The method for manufacturing the semiconductor device according to claim 1 wherein the thickness of the second silicon film is in the range of 10 to 70 nm.

6. The method for manufacturing the semiconductor device according to claim 1 wherein the thickness of the third silicon film is in the range of 5 to 60 nm.

* * * * *